United States Patent [19]

Bloss, III et al.

[11] Patent Number: 4,513,305

[45] Date of Patent: Apr. 23, 1985

[54] MULTI-WAVELENGTH DEMULTIPLEXER FOR FIBER OPTICAL COMMUNICATION

[75] Inventors: Walter L. Bloss, III, Sudbury; Edward M. Brody, Wayland, both of Mass.

[73] Assignee: GTE Laboratories Incorporated, Waltham, Mass.

[21] Appl. No.: 446,902

[22] Filed: Dec. 6, 1982

[51] Int. Cl.$^3$ ............................................. H01L 27/14
[52] U.S. Cl. ......................................... 357/30; 357/16; 357/61; 357/65; 357/71
[58] Field of Search ...................... 357/30, 16, 68, 19, 357/65, 71, 17, 37, 61

[56] References Cited

U.S. PATENT DOCUMENTS 4,213,138  7/1980  Campbell et al. .................... 357/16
4,301,463  11/1981 Burrus et al. ........................ 357/30
4,323,911  5/1982  Campbell et al. .................... 357/30

Primary Examiner—James W. Davie
Assistant Examiner—Georgia Epps
Attorney, Agent, or Firm—Fred Fisher

[57] ABSTRACT

A multi-wavelength optical demultiplexer includes at least three relatively thick layers of direct band gap semiconductor material deposited on a substrate. The various thick layers are separated by respective, individual, relatively thin layers of lattice matched material having a larger band gap than the materials in the thick layers. The thin layers, deposited on the thick layers, serve as a potential barrier to prevent photo-electrons generated in one layer from entering another. Ohmic contacts of donor impurity diffusion are provided at opposite ends of each relatively thick layer. With a substrate of gallium arsenide, the relatively thick layers can be aluminum gallium arsenide of varying compositions, in which the proportions of aluminum to gallium decreases from the layer distal to the substrate to the layer proximal to the substrate. Each of the relatively thin layers can be aluminum arsenide; the relatively thick layers are on the order of ten microns thick; the relatively thin layers are on the order of 100 Angstroms thick. When the substrate is indium phosphide, the relatively thick layers are indium gallium arsenide phosphide in which the relatively thick layers are in the order $In_xGa_{1-x}As_yP_{1-y}$ for $x=2.16(1-x)$ where each of the layers can be produced by the process of molecular beam epitaxy.

10 Claims, 2 Drawing Figures

4,513,305

MULTI-WAVELENGTH DEMULTIPLEXER FOR FIBER OPTICAL COMMUNICATION

BACKGROUND OF THE INVENTION

This invention relates to a multi-wavelength demultiplexer, and, in particular, one that is an integrated, multi-layered structure especially suitable for fiber optical communication. Accordingly, it is a general object of this invention to provide new and improved devices of such character.

Communication through the utilization of optical fibers is well known. For example, techniques have been applied in optical communication in which light at one frequency is transmitted along an otpical fiber in one direction and light at a different frequency is transmitted along the same fiber in the opposite direction.

It is desirable, in order to increase the communication capability of an optical fiber, to transmit a plurality of signals at optical frequencies therealong, either in the same direction or in both directions. Hence, it is a purpose of this instant invention to provide a device that has the ability to demultiplex or to discriminate among the various frequencies transmitted simultaneously through an optical fiber.

A two-wavelength demultiplexing photodetector is discussed in the literature in "Improved Two-Wavelength Demultiplexing InGaAsP Photodetector" by J. C. Campbell et al., *IEEE Journal of Quantum Electronics,* Vol. QE-16, No. 6, June 1980, pp 601–603. Their method of detection of current response utilizes a p-n junction, whereby current flow is perpendicular to the various layers of there device. Their device is a two-wavelength demultiplexer.

In contradistinction to such a known structure, the instant invention utilizes contacts applied to the ends of various layers of a multilayered device. Hence, current flow is within the various layers, being confined by high band gap material (such as thin layers of aluminum arsenide). The instant invention has greater versatility in that more than two wavelengths can be multiplexed.

SUMMARY OF THE INVENTION

Another object of this invention is to provide a new and improved multi-wavelength, multi-layered demultiplexing device in which a different wavelength is detected by each layer.

Yet another object of this invention is to provide a new and improved multi-wavelength demultiplexing device which is capable of detecting three or more different wavelengths simultaneously.

Still another object of this invention is to provide a new and improved multi-wavelength demultiplexing device for optical fiber communication, which device incorporates an integrated multi-layered structure in which ohmic contacts are applied to each layer at opposite ends thereof.

In accordance with one aspect of the invention, a multi-wavelength optical demultiplexer includes a first relatively thick layer of a direct band gap semiconductor material deposited on a substrate. A first relatively thin layer of latticed matched material, deposited on the first relatively thick layer, serves as a potential barrier to prevent photo-electrons generated in one layer from entering another. A second relatively thick layer of direct band gap semiconductor material is deposited on the first relatively thin layer. A second relatively thin layer of latticed matched material, deposited on the second relatively thick layer, serves as a potential barrier to prevent photo-electrons generated in one layer from entering another. A third relatively thick layer of direct band gap semiconductor material is deposited on the second relatively thin layer. Ohmic contacts of donor impurity diffusion is provided at opposite ends of each relatively thick layer. Each relatively thin layer of latticed matched material has a larger band gap than the materials in the thick layers.

In accordance with certain features of the invention, each relatively thin layer consists essentially of aluminum arsenide. In one feature, the substrate can be gallium arsenide; the first relatively thick layer is $Al_cGa_{1-c}As$; the second relatively thick layer is $Al_bGa_{1-b}As$; the third relatively thick layer is $Al_aGa_{1-a}As$; and each relatively thin layer is aluminum arsenide, wherein $a > b > c$. The impurity can be silicon. Each of the layers can be produced by the process of molecular beam epitaxy. Each relatively thick layer can be on the order of 10 microns thick, and each relatively thin layer can be on the order of 100 Angstroms thick. In one feature, a is less than or equal to 0.37. In another feature, the first relatively thick layer is $Ga_{0.9}Al_{0.1}As$ and has a thickness on the order of one to three microns; the second relatively thick layer is $Ga_{0.8}Al_{0.2}As$ and has a thickness on the order of one to three microns; the third relatively thick layer is $Ga_{0.7}Al_{0.3}As$ and has a thickness on the order of one to three microns; and each of the relatively thin layers is $Ga_{0.63}Al_{0.37}As$, having a thickness on the order of 100 Angstroms.

In accordance with still another feature of the invention, the substrate is indium phosphide. The first relatively thick layer is $In_cGa_{1-c}As_xP_{1-x}$; the second relatively thick layer is $In_bGa_{1-b}As_yP_{1-y}$; the third relatively thick layer is $In_aGa_{1-a}As_zP_{1-z}$; $a > b > c$; $x = 2.16(1-c)$, $y = 2.16(1-b)$, and $z = 2.16(1-a)$. Each of the layers can be produced by the process of molecular beam epitaxy.

BRIEF DESCRIPTION OF THE DRAWINGS

Other objects, advantages and features of this invention, together with its construction and mode of operation, will become more apparent from a reading of the following description, when read in conjunction with accompanying drawings, in which.

DESCRIPTION OF THE INVENTION

Figure 1:
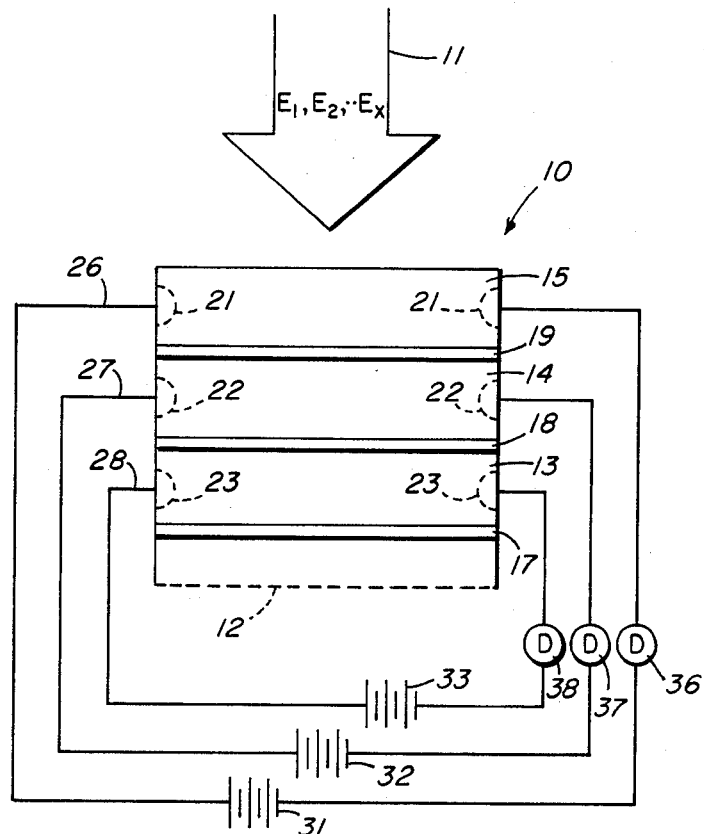
FIG. 1 is a diagrammatical view, partly in cross section, with the vertical dimension exaggerated, of one embodiment of the invention.

Referring to FIG. 1, there is depicted a multi-wavelength optical demultiplexer 10, suitable for fiber optical communication. The demultiplexer 10 is adapted to receive light from a suitable light source such as an optical fiber 11. The optical fiber 11 can be either directly coupled to the demultiplexer 10 or can be indirectly coupled thereto by suitable means such as a lens.

The demultiplexer 10 includes a suitable substrate 12 on which is deposited a plurality of layers of material. The layers can be suitably provided through the techniques of molecular beam epitaxy.

In a preferred embodiment, the demultiplexer 10 is adapted to discriminate among at least three different frequencies or wavelengths. As shown in FIG. 1, there are three relatively thick layers of direct band gap semiconductor material 13, 14, 15.

The principle of operation is to utilize the photo absorption property of the direct band gap semiconductor material in which, by composition variation, the band gap is varied. An example of such a system is $Al_xGa_{1-x}As$ for $x \leq 0.37$, lattice matched to a gallium arsenide substrate 12. Another example is $In_xGa_{1-x}As_yP_{1-y}$ for $y = 2.16(1-x)$, lattice matched to an indium phosphide substrate 12. The structure 10 is constructed of layers of material 15, 14, 13 of decreasing band gap, with different compositional arrangement as viewed in FIG. 1. Each layer 13, 14, 15 is on the order of 10 microns thick. The $10\mu$ layers 13, 14, 15 are separated by thin layers 17, 18, 19 that are on the order of 100 Angstroms thick of a lattice matched material having a larger band gap than the materials in the thick layers 13, 14, 15. The thin layers 17, 18, 19 serves as a potential barrier to prevent photo-electrons generated in one layer from entering another. This is illustrated by the conduction band diagram of FIG. 2.

Figure 2:
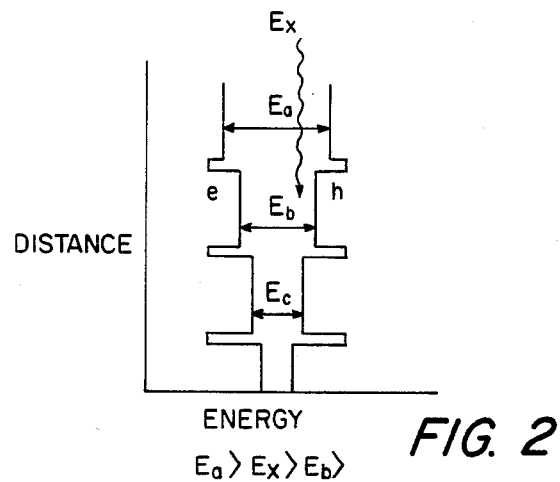
FIG. 2 is a conduction band diagram illustrating the relationship between energy and distance for various layers of the embodiment shown in FIG. 1.

A thick layer, referred to in FIG. 2 as b has a band gap $E_b$; the layer above has a larger band gap $E_a$; and the layer below has a smaller band gap $E_c$. Light, whose photon energy $E_x$ is in the range $E_a > E_x > E_b$, is transmitted through layer a and is absorbed in layer b, generating electron-hole pairs. These pairs produce a photo current which measure the intensity of the radiation at the wavelength being absorbed. Similarly for $E_b > E_x > E_c$, absorption occurs in layer c with transmission through layers a and b.

Therefore, each thick layer absorbs light whose wavelength or frequency is within a certain range. The top layer a absorbs when $E_x > E_a$. Any radiation for which $E_x < E_l$, where l is the lowest thick layer, passes through the entire structure with negligible absorption.

The 100Å intervening, electron-confining layers can be easily produced, as with the thicker layers, through the techniques of molecular beam epitaxy. The demultiplexer structure 10 can be formed of lattice matched materials, such as $Al_xGa_{1-x}As$, with $x \leq 0.37$ for the thick layers, with the thin layers being formed of aluminum arsenide.

As the entire structure 10 is formed of a single crystal, optical losses are minimized due to reduced scattering at interfaces and good electron transport within a layer due to the absence of impurities.

Ohmic contacts 21-21, 22-22, 23-23 are provided to the thick layers 15, 14, 13, respectively, using diffusion of a donor impurity, such as silicon, to create n-type material at the edges. Separate contacts are then made to each layer via appropriate lines 26, 27, 28 to appropriate voltage sources 31, 32, 33, respectively, and optical detectors 36, 37, 38, respectively.

The width of the structure 10 can have a lateral extent comparable to the end dimensions of an optical fiber core, on the order of 100 microns, for example.

In summary, in accordance with this invention, a layered gallium aluminum arsenide structure has been set forth, being formed of $Ga_xAl_{1-x}As$ in which x varies from layer to layer. The layer furthest from the substrate has an x closet to 0, whereas the layers closest to the substrate have an x closer to 1. With such a format, the band gap decreases from top to bottom, that is, from distal to the substrate to proximal to the substrate, in the structure. Each layer absorbs radiation in a band. When a layer does not absorb the radiation, the radiation is transmitted to the next layer. When the radiation is absorbed, photo-electrons are generated. Between each layer 15, 14, 13 of gallium aluminum arsenide is a layer of aluminum arsenide which confines the photo-excited electrons to that layer. The gallium aluminum arsenide layers can be in the order of one to ten microns thick to achieve good absorption. The aluminum arsenide layers can be 100 Angstroms thick, large enough to serve as electron barriers, but thin enough to pass optical frequencies without significant loss. The $Ga_xAl_{1-x}As$ layers can be n doped and contacts applied.

To extend the demultiplexer to longer wavelengths, indium gallium arsenide phosphide materials can be used of the order of $In_xGa_{1-x}As_yP_{1-y}$, and x and y again varied to give a series of materials of decreasing band gaps.

Various modifications can be performed without departing from the spirit and scope of this invention. For example, an integrated circuit can be formed, not only of the various layers 13, 14, 15, 17, 18, 19 deposited on the substrate 12, but also the lead lines 26, 27, 28 and the detectors 36, 37, 38 can be provided on the same substrate to provide an integrated article.

What is claimed is:

1. A multi-wavelength optical demultiplexer comprising
    a substrate;
    a first relatively thick layer of a direct band gap semiconductor material deposited on said substrate;
    a first relatively thin layer of latticed matched material having a larger band gap than the materials in the first thick layer, deposited on said first relatively thick layer, for serving as a potential barrier to prevent photo-electrons generated in one layer from entering another;
    a second relatively thick layer of direct band gap semiconductor material deposited on said first relatively thin layer;
    a second relatively thin layer of latticed matched material having a larger band gap than the materials on said substrate, deposited on said second relatively thick layer, for serving as a potential barrier to prevent photo-electrons generated in adjacent thick layer from entering another;
    a third relatively thick layer of direct band gap semiconductor material deposited on said second relatively thin layer; and
    ohmic contacts of donor impurity diffusion at opposite ends of each of said relatively thick layers,
    wherein each of said relatively thick layers is on the order of one to ten microns thick to achieve good absorption, and
    wherein each of said relatively thin layers is on the order of 100 Angstroms thick, large enough to serve as electron barriers, but thin enough to pass optical frequencies without significant loss.

2. The demultiplexer as recited in claim 1 wherein each of said relatively thin layers consists essentially of aluminum arsenide.

3. The demultiplexer as recited in claim 1 wherein said substrate is GaAs, said first relatively thick layer is $Al_cGa_{1-c}As$, said second relatively thick layer is $Al_bGa_{1-b}As$, said third relatively thick layer is $Al_aGa_{1-a}As$, each of said relatively thin layers is AlAs, and $a > b > c$.

4. The demuliplexer as recited in claim 3 wherein said impurity is silicon.

5. The demultiplexer as recited in claim 3 wherein said first relatively thick layer is molecular beam epitaxially deposited on said substrate, said first relatively thin layer is molecular beam epitaxially deposited on said first relatively thick layer, said second relatively thick layer is molecular beam epitaxially deposited on said first relatively thin layer, said second relatively thin layer is molecular beam epitaxially deposited on said second relatively thick layer, and said third relatively thick layer is molecular beam epitaxially deposited on said second relatively thin layer.

6. The demultiplexer as recited in claim 1 wherein each of said relatively thick layers is on the order of 10 $\mu$m thick.

7. The demultiplexer as recited in claim 3 wherein $a \leq 0.37$.

8. The demultiplexer as recited in claim 1 wherein said first relatively thick layer is $Ga_{0.9}Al_{0.1}As$ and has a thickness on the order of one to three microns;

said second relatively thick layer is $Ga_{0.8}Al_{0.2}As$ and has a thickness on the order of one to three microns;

said third relatively thick layer is $Ga_{0.7}Al_{0.3}As$ and has a thickness on the order of one to three microns; and each of said relatively thin layers is $Ga_{0.63}Al_{0.37}As$.

9. Tthe demultiplexer as recited in claim 1 wherein said substrate is indium phosphide, said first relatively thick layer is $In_cGa_{1-c}As_xP_{1-x}$, said second relatively thick layer is $In_bGa_{1-b}As_yP_{1-y}$, said third relatively thick layer is $In_aGa_{1-a}As_zP_{1-z}$, $a > b > c$, $x = 2.16(1-c)$, $y = 2.16(1-b)$, and $z = 2.16(1-a)$.

10. The demultiplexer as recited in claim 9 wherein said first relatively thick layer is molecular beam epitaxially deposited on said substract, said first relatively thin layer is molecular beam epitaxially deposited on said first relatively thick layer, said second relatively thick layer is molecular beam epitaxially deposited on said first relatively thin layer, said second relatively thin layer is molecular beam epitaxially deposited on said second relatively thick layer, and said third relatively thick layer is molecular beam epitaxially deposited on said second relatively thin layer.

* * * * *